(12) United States Patent
Yoo et al.

(10) Patent No.: US 9,934,990 B2
(45) Date of Patent: Apr. 3, 2018

(54) METHOD OF MANUFACTURING A COOLER FOR SEMICONDUCTOR MODULES

(71) Applicant: Infineon Technologies AG, Neubiberg (DE)

(72) Inventors: Inpil Yoo, Unterhaching (DE); Andreas Grassmann, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/420,321

(22) Filed: Jan. 31, 2017

(65) Prior Publication Data

US 2017/0140946 A1  May 18, 2017

Related U.S. Application Data

(62) Division of application No. 14/636,256, filed on Mar. 3, 2015, now Pat. No. 9,613,885.

(51) Int. Cl.
| | | |
|---|---|---|
| *H01L 21/48* | (2006.01) | |
| *H01L 23/473* | (2006.01) | |
| *H01L 23/498* | (2006.01) | |
| *H01L 23/18* | (2006.01) | |
| *H01L 21/54* | (2006.01) | |

(Continued)

(52) U.S. Cl.
CPC ...... *H01L 21/4882* (2013.01); *H01L 21/4817* (2013.01); *H01L 21/4875* (2013.01); *H01L 21/54* (2013.01); *H01L 21/565* (2013.01); *H01L 23/08* (2013.01); *H01L 23/18* (2013.01); *H01L 23/3142* (2013.01); *H01L 23/3672* (2013.01); *H01L 23/3737* (2013.01);

(Continued)

(58) Field of Classification Search
CPC combination set(s) only.
See application file for complete search history.

(56) References Cited

U.S. PATENT DOCUMENTS 5,270,571 A   12/1993  Parks et al.
5,350,713 A    9/1994  Liang
(Continued)

FOREIGN PATENT DOCUMENTS

CN    102299079 A   12/2011
DE  102014106134 A1  11/2014
(Continued)

*Primary Examiner* — Mamadou Diallo
(74) *Attorney, Agent, or Firm* — Murphy, Bilak & Homiller, PLLC

(57) ABSTRACT

A cooling apparatus is manufactured by: receiving a discrete module by a first singular part, the discrete module including a semiconductor die encapsulated by a mold compound, a plurality of leads electrically connected to the semiconductor die and protruding out of the mold compound, and a first cooling plate at least partly uncovered by the mold compound; attaching a second singular part to a periphery of the first part to form a housing, the housing surrounding a periphery of the discrete module, the second part having a cutout which exposes the first cooling plate and a sealing structure facing a side of the discrete module with the first cooling plate; and filling the sealing structure with a sealing material which forms a water-tight seal around the periphery of the discrete module at the side of the discrete module with the first cooling plate.

15 Claims, 8 Drawing Sheets

(51) Int. Cl.
  *H01L 23/373* (2006.01)
  *H01L 23/44* (2006.01)
  *H01L 21/56* (2006.01)
  *H01L 23/08* (2006.01)
  *H01L 23/367* (2006.01)
  *H01L 23/31* (2006.01)

(52) U.S. Cl.
  CPC ............ *H01L 23/44* (2013.01); *H01L 23/473* (2013.01); *H01L 23/49811* (2013.01); *H01L 23/3107* (2013.01)

(56) References Cited

U.S. PATENT DOCUMENTS

| | | | |
|---|---|---|---|
| 6,052,284 | A | 4/2000 | Suga et al. |
| 7,285,851 | B1 | 10/2007 | Cepeda-Rizo et al. |
| 2006/0002086 | A1 | 1/2006 | Teneketges et al. |
| 2008/0160246 | A1 | 7/2008 | Buhler et al. |
| 2008/0239671 | A1 | 10/2008 | Amano et al. |
| 2008/0272485 | A1 | 11/2008 | Myers et al. |
| 2009/0057882 | A1 | 3/2009 | Gerbsch |
| 2009/0101316 | A1 | 4/2009 | Han |
| 2009/0146293 | A1 | 6/2009 | Olesen |
| 2011/0122583 | A1 | 5/2011 | Lowry |
| 2011/0164385 | A1 | 7/2011 | Hou et al. |
| 2011/0299244 | A1 | 12/2011 | Dede et al. |
| 2012/0152498 | A1 | 6/2012 | Lyon |
| 2012/0257354 | A1 | 10/2012 | Dede |
| 2013/0146253 | A1 | 6/2013 | Daly |
| 2013/0154081 | A1* | 6/2013 | Kadoguchi ............ H01L 23/36 257/712 |
| 2013/0258592 | A1 | 10/2013 | Brandenburg et al. |
| 2013/0341782 | A1 | 12/2013 | Kim et al. |
| 2013/0343001 | A1 | 12/2013 | Kwak et al. |
| 2014/0327128 | A1* | 11/2014 | Yoo .................... H01L 21/4803 257/713 |

FOREIGN PATENT DOCUMENTS

| | | |
|---|---|---|
| EP | 0709884 A2 | 5/1996 |
| EP | 1965424 A2 | 9/2008 |
| EP | 2034521 A2 | 3/2009 |
| EP | 2164100 A2 | 3/2010 |
| EP | 2325880 A2 | 5/2011 |
| EP | 2645839 A2 | 10/2013 |
| EP | 2374020 A1 | 5/2014 |
| JP | 2012004359 A | 1/2012 |
| JP | 2012009734 A | 1/2012 |
| JP | 2012044828 A | 3/2012 |
| JP | 2013030579 A | 2/2013 |

* cited by examiner

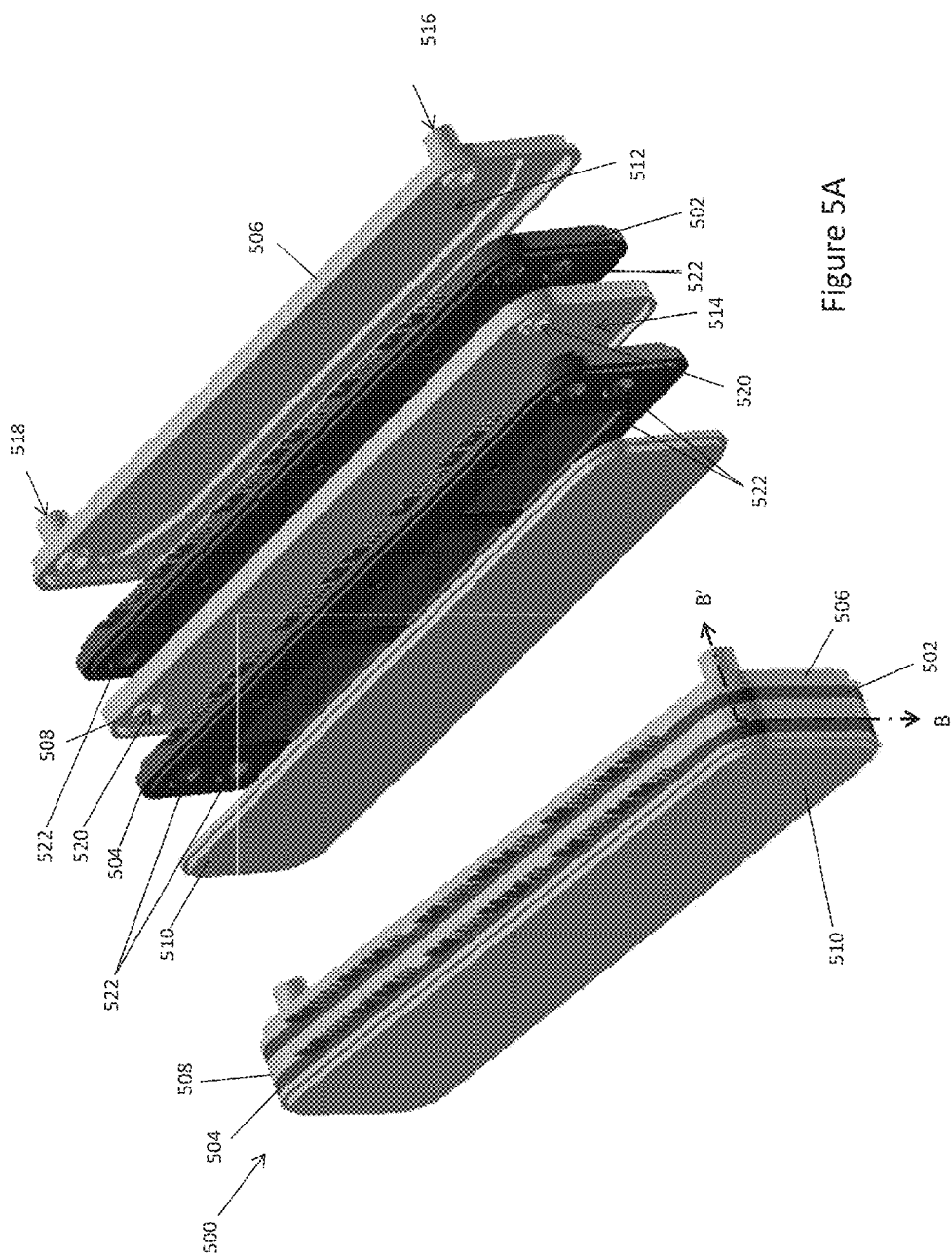

METHOD OF MANUFACTURING A COOLER FOR SEMICONDUCTOR MODULES

TECHNICAL FIELD

The instant application relates to semiconductor modules, and more particularly to cooling systems for semiconductor modules.

BACKGROUND

Power modules with double-side cooling significantly improve the thermal performance of the package by reducing thermal resistance, and thereby increasing the power density of the entire system. However, power modules with double-sided cooling present a challenge with regard to integrating a heat-sink with the module. The design of the cooler often is a critical issue in achieving the highest possible performance. For example, the cooling fluid should be distributed in two different channels above and below the power modules included in the package to increase the thermal performance of the package. Also, the entire system must be watertight. The heat sink should be robust, low-cost and lightweight.

Conventional double-sided module cooling technologies require additional parts such as O-rings and bolts or screws to achieve a water-tight system. Conventional aluminum coolers also use thicker aluminum blocks. Still further components are typically needed to achieve a watertight heat-sink and bi-directional coolant distribution. These additional parts increase the system weight and cost and still present a real risk of fluid leakage. Furthermore, the need for many assembly steps increases production cost.

SUMMARY

Embodiments described herein provide a cooling system for molded semiconductor modules without using bolt connections or O-rings. The cooling system described herein has a much lower risk of fluid leakage and higher design flexibility compared to conventional power module cooling systems, significantly reducing system cost, the number of assembly steps and system weight.

According to an embodiment of a cooling apparatus, the cooling apparatus comprises a plurality of discrete modules and a plastic housing. Each module comprises a semiconductor die encapsulated by a mold compound, a plurality of leads electrically connected to the semiconductor die and protruding out of the mold compound and a first cooling plate at least partly uncovered by the mold compound. The plastic housing surrounds the periphery of each module to form a multi-die module. The plastic housing includes a first singular plastic part which receives the modules and a second singular plastic part attached to a periphery of the first plastic part. The second plastic part has cutouts which expose the first cooling plates and a sealing structure containing a sealing material which forms a water-tight seal around the periphery of each module at a side of the modules with the first cooling plates.

According to an embodiment of a method of manufacturing a cooling apparatus, the method comprises: receiving a plurality of modules by a first singular plastic part, each of the modules comprising a semiconductor die encapsulated by a mold compound, a plurality of leads electrically connected to the semiconductor die and protruding out of the mold compound, and a first cooling plate at least partly uncovered by the mold compound; attaching a second singular plastic part to a periphery of the first plastic part to form a plastic housing, the plastic housing surrounding a periphery of each module to form a multi-die module, the second plastic part having cutouts which expose the first cooling plates and a sealing structure facing a side of the modules with the first cooling plates; and filling the sealing structure with a sealing material which forms a water-tight seal around the periphery of each module at the side of the modules with the first cooling plates.

According to another embodiment of a cooling apparatus, the cooling apparatus comprises a plurality of discrete modules each of which comprises a semiconductor die encapsulated by a mold compound, a plurality of leads electrically connected to the semiconductor die and protruding out of the mold compound, and a first cooling plate at least partly uncovered by the mold compound. The cooling apparatus further comprises a first and second plastic housing each of which surrounds a periphery of a different subset of the modules to form separate multi-die modules. Each of the plastic housings comprises a first singular plastic part which receives the corresponding subset of modules and a second singular plastic part attached to a periphery of the first plastic part, the second plastic part having cutouts which expose the first cooling plates and a sealing structure containing a sealing material which forms a water-tight seal around the periphery of each module at a side of the modules with the first cooling plates. The cooling apparatus also comprises first, second and third covers. The first cover is attached to a periphery of the second plastic part of the first plastic housing so as to form a water-tight seal with the second plastic part of the first plastic housing and an enclosed cavity between the first cover and the second plastic part, the enclosed cavity configured to permit fluid flow over the first cooling plates of each discrete module included in the first plastic housing. The second cover is interposed between and attached to the first and the second plastic housings. The second cover is attached to a periphery of the second plastic part of the second plastic housing so as to form a water-tight seal with the second plastic part of the second plastic housing and an enclosed cavity between the second cover and the second plastic part, the enclosed cavity configured to permit fluid flow over the first cooling plates of each discrete module included in the second plastic housing. The third cover is attached to a side of the second plastic housing opposite the second cover.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIGS. 5A and 5B illustrates an embodiment of a plurality of covers attached to a plurality of plastic housings to form a water-tight cooling apparatus.

DETAILED DESCRIPTION

According to embodiments described herein, a cooling system for molded semiconductor modules is provided. Each semiconductor module includes a semiconductor die encapsulated by a mold compound, a plurality of leads electrically connected to the semiconductor die and at least partly uncovered by the mold compound, and a first cooling plate at least partly uncovered by the mold compound. The cooling system further comprises a plastic housing which surrounds the periphery of each module to form a multi-die module. The plastic housing includes a first singular plastic part which receives the modules and a second singular plastic part attached to a periphery of the first plastic part. The second plastic part has cutouts which expose the first cooling plates and a sealing structure containing a sealing material which forms a water-tight seal around the periphery of each module at a side of the modules with the first cooling plates.

In the case of double-sided cooling, each discrete module has a second cooling plate at a side opposite the first cooling plate and the first plastic part has cutouts which expose the second cooling plates. The first plastic part also has a sealing structure containing additional sealing material which forms a water-tight seal around the periphery of each module at the side of the modules with the second cooling plates. A cover can be attached to the periphery of one or both plastic parts to form a water-tight seal with the corresponding plastic part. An enclosed cavity between each cover and the corresponding plastic part permits fluid flow over the cooling plates of each discrete module. The cooling system does not require bolt connections or O-rings. As such, the cooling system has a much lower risk of fluid leakage and higher design flexibility compared to conventional power module cooling systems, significantly reducing system cost, the number of assembly steps and system weight.

Figure 1:
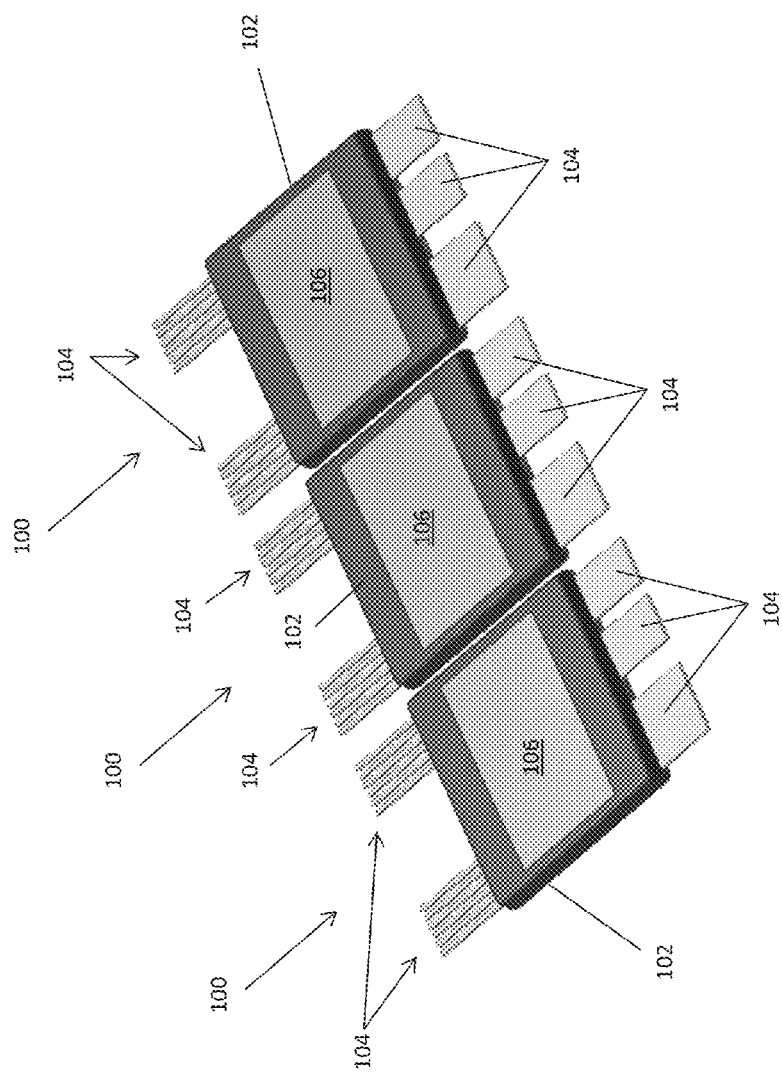
FIG. 1 illustrates an embodiment of a plurality of discrete modules.

FIG. 1 shows an embodiment of a plurality of discrete modules 100. The modules 100 can be purchased or manufactured. In either case, each module 100 comprises a semiconductor die encapsulated by a mold compound 102 such as an epoxy, a plurality of leads 104 electrically connected to the semiconductor die and at least partly uncovered by the mold compound 102, and a cooling plate 106 at least partly uncovered by the mold compound 102. The leads 104 provide the necessary electrical connections to the semiconductor die. The leads 104 can be of the lead-frame type which protrude out from the mold compound 102 of the modules 100 as shown in FIG. 1. Other types of leads 104 can be used such as the kind used in surface-mount modules, e.g. gull-wing, J-lead or flat leads.

The semiconductor dies) included in each discrete module 100 and connected to the corresponding leads 104 can be any type of semiconductor die requiring liquid cooling during operation such as an IGBT (insulated gate bipolar transistor) die, power MOSFET (metal oxide semiconductor field effect transistor) die, JFET (junction field effect transistor) die, GaN die, SiC die, thyristor die, power diode die, etc. More than one semiconductor die can be included in some or all of the modules 100, as well as passive components. The semiconductor dies can form any type of desired circuit such as a half-bridge, full-bridge or 3-phase circuit, etc.

Each discrete module 100 can have a single cooling plate 106 at one side of the module 100, or a pair of spaced apart cooling plates 106 at opposing sides of the module 100 with the corresponding semiconductor die interposed between the pair of cooling plates 106 (the bottom module cooling plates are out of view in FIG. 1). In either case, the module cooling plates 106 remain at least partly uncovered by the mold compound 102 of the corresponding module 100. The cooling plates 106 can have surface structures such as pins, fins or an intentionally roughened surface at a side of the cooling plates for increasing the turbulence of fluid flowing over the cooling plates.

Figure 2:
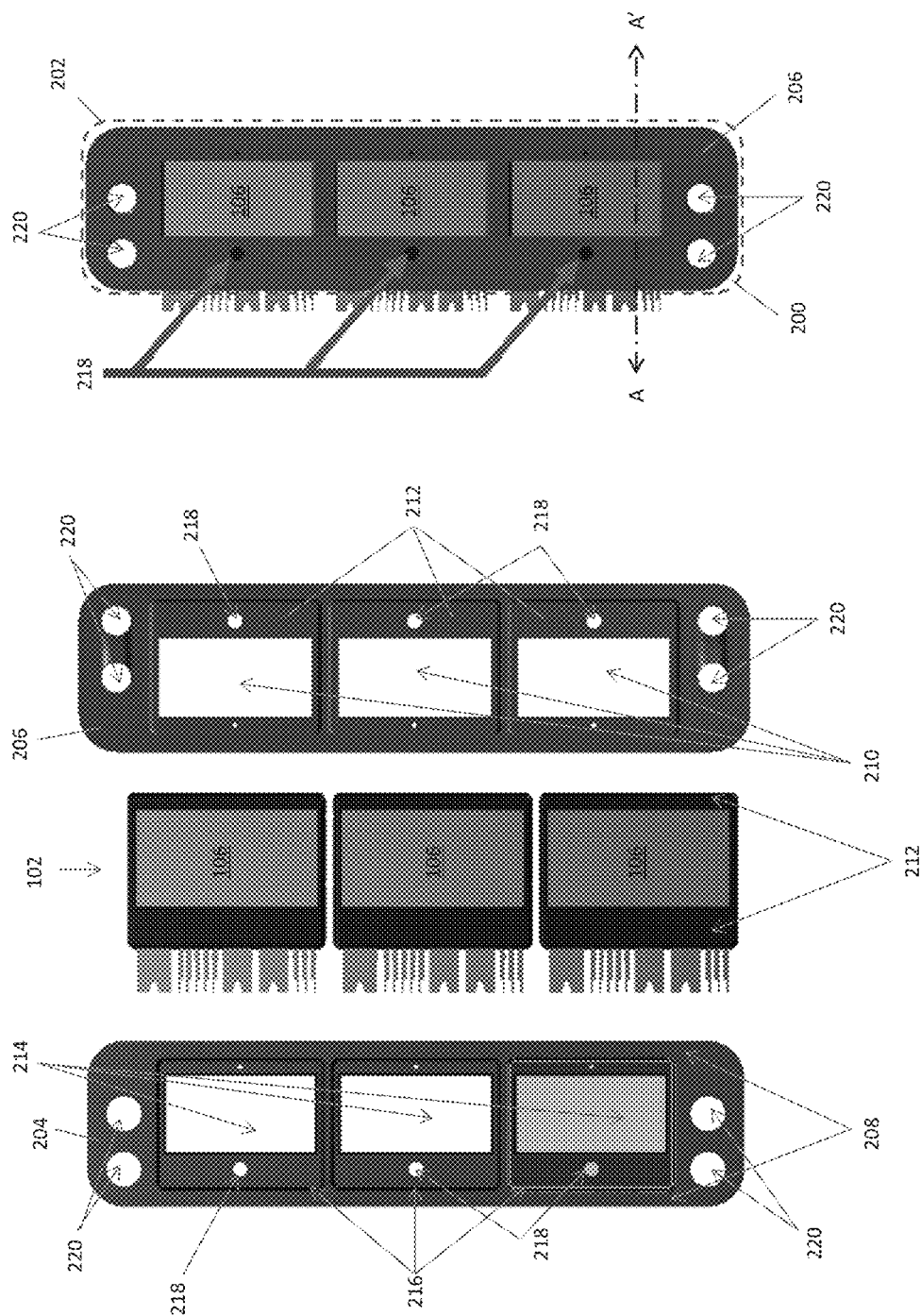
FIGS. 2A and 2B illustrate an embodiment of a plastic housing which surrounds the periphery of a plurality of discrete modules to form a multi-die module.

In FIGS. 2A and 2B, a plastic housing 200 is formed which surrounds the periphery of each module 102 to form a multi-die module 202. FIG. 2A shows the plastic housing 200 prior to assembly, and FIG. 2B shows the plastic housing 200 after assembly.

The plastic housing 200 includes first and second singular (i.e. individual or discrete) plastic parts 204, 206. The plastic parts 204, 206 can be formed using any standard process such as injection molding, 3-D printing, etc. In general, the first singular plastic part 204 receives the modules 102. The second singular plastic part 206 is attached to the periphery 208 of the first plastic part 204 and has cutouts 210 which expose the first cooling plates 106 of the modules 102. The second plastic part 206 also has a sealing structure 212 for containing a sealing material which forms a water-tight seal around the periphery 212 of each module 102 at a side of the modules 102 with the first cooling plates 106 after assembly.

In the case of a double-side cooling configuration as shown in FIGS. 2A and 2B, each discrete module 102 has a second cooling plate (out of view) at the side opposite the first cooling plate 106. According to this embodiment, the first plastic part 204 also has cutouts or windows 214 which expose the second cooling plates and a sealing structure 216 for containing sealing material which forms a water-tight seal around the periphery 212 of each module 102 at the side of the modules with the second cooling plates.

Both plastic parts 204, 206 have one or more openings 218 along their respective lengths for injecting the sealing material into the sealing structure 212, 216 of the corresponding plastic part 204, 206. The plastic parts 204, 206 can also include one or more openings 220 at one or both ends of the plastic parts 204, 206 for allowing fluid flow from one side of the housing 200 to the other side after covers are attached to both sides of the assembled plastic housing 200. The first plastic part 204 can be attached to the second plastic part 206 using any standard plastic attach process such as plastic welding, laser welding, heat sealing, gluing, etc.

Figure 3:
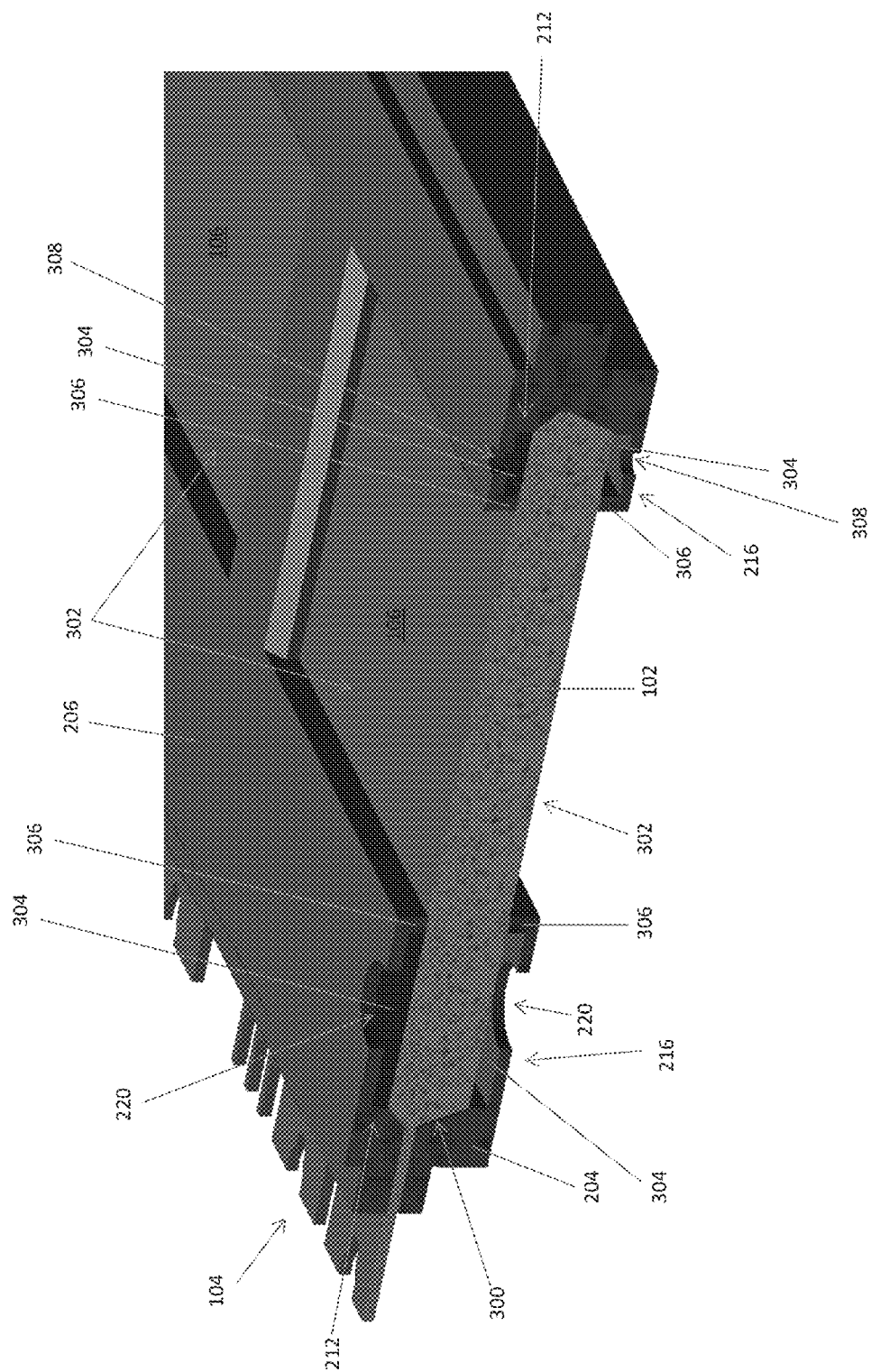
FIG. 3 illustrates a sectional view of the assembled multi-die module along the line labeled A-A' in FIG. 2B.

FIG. 3 shows a sectional view of the assembled multi-die module 202 along the line labeled A-A' in FIG. 2B. The first plastic part 204 has recessed regions 300 for receiving the discrete modules 102. The discrete modules 102 are seated in the respective recessed regions 300. Each discrete module 102 has a pair of spaced apart cooling plates 106 according to this embodiment, as previously described herein. The recessed regions 300 have cutouts or windows 302 so that the lower cooling plates 106 remain at least partly uncovered by the plastic housing 200 after assembly. The plastic housing 200 can have open passageways 220 at opposing ends of the housing 200 as shown in FIGS. 2A and 2B, to permit a fluid to flow in direct contact with the cooling plates 106 at both sides of the discrete modules 102.

The leads 104 of each discrete module 104 remain at least partly uncovered by the plastic housing 200. In the case of lead-frame type or similar leads, the leads 104 of each discrete module 102 protrude out of the plastic housing 200 as shown in FIGS. 2B and 3. A different module lead configuration is possible with other types of module leads such as surface-mount leads. In each case, electrical connections can be made to the discrete modules 102 and the discrete modules 102 can be directly cooled at the exposed side of the cooling plates 106.

Further according to the double-sided cooling embodiment shown in FIG. 3, the first and second plastic parts 204, 206 of the plastic housing 200 both have respective sealing structures 216, 212. Each sealing structure 216, 212 comprises a groove or passage 304 formed in the corresponding plastic part 204, 206 which surrounds the periphery of each module 102 at the side of the module 102 with a cooling plate 106. Each groove 304 is configured to be filled with a sealing material that forms a water-tight seal around the periphery of the corresponding module 102. The (upper and lower) cooling plates 106 remain exposed due to the cutouts or windows 302 formed in the first and second plastic parts 204, 206 of the plastic housing 200. A part 306 of each plastic part 204, 206 disposed interiorly from the grooves 304 contacts the side of the modules 102 with a cooling plate 106 and forms a dam-like structure which prevents sealing material from leaking onto the cooling plates 106. The sealing material can be injected into the grooves 304 through one or more openings 220 formed in the first and second plastic parts 204, 206 of the housing 200. The plastic housing parts 204, 206 can include additional openings 308 for ventilation.

Figure 4B:
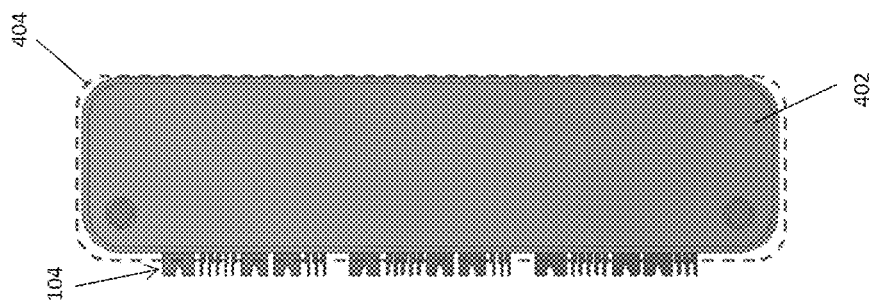
FIGS. 4A and 4B illustrate an embodiment of two covers attached to respective sides of a plastic housing to form a water-tight cooling apparatus.
Figure 4A:
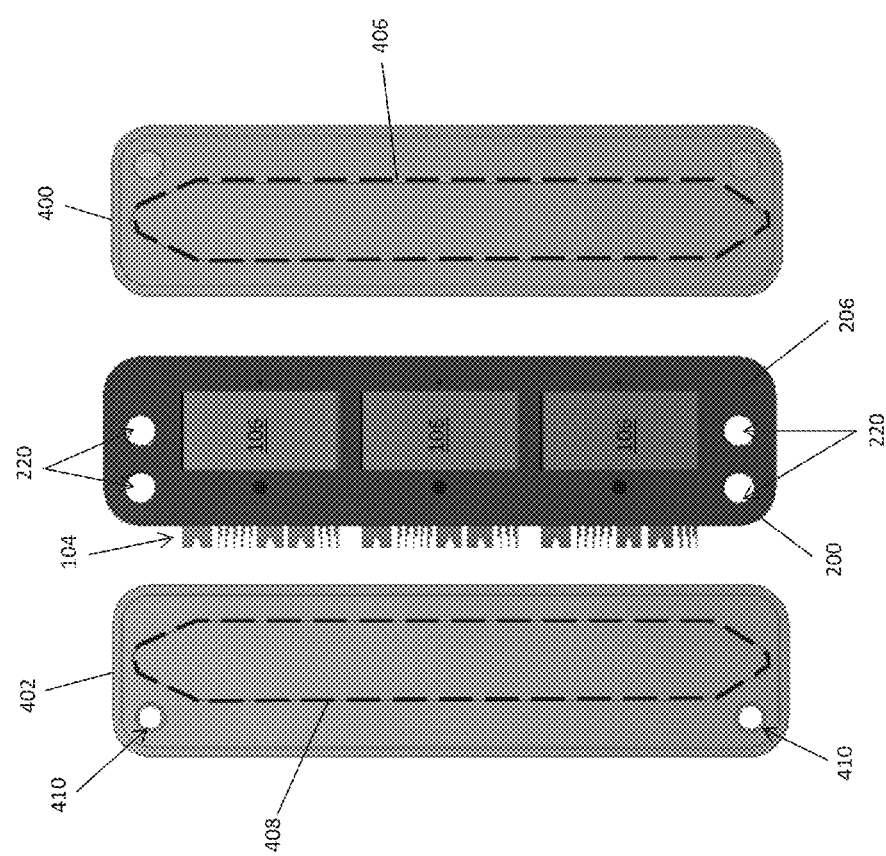

In FIGS. 4A and 4B, respective covers 400, 402 are attached to both sides of the plastic housing 200 to form a cooling apparatus 404. FIG. 4A shows the covers 400, 402 and plastic housing 200 prior to assembly, and FIG. 4B shows the cooling apparatus 404 after assembly.

A first cover 400 is attached to the periphery of the second plastic part 406 and forms a water-tight seal with the second plastic part 206. An enclosed cavity 406 is formed between the first cover 400 and the second plastic part 206. The enclosed cavity 406 is configured to permit fluid flow over the first cooling plates 106 of each discrete module 102. The second cover 402 is attached to a periphery of the first plastic part 204 and forms a water-tight seal with the first plastic part 204. An enclosed cavity 406 between the second cover 402 and the first plastic part 204 is configured to permit fluid flow over the second cooling plates 106 of each discrete module 102.

On or both covers 400, 402 have at least one port 410 for permitting fluid flow into and out of the cooling apparatus 404. The fluid flows within the enclosed cavities 406, 408 formed between the respective covers 400, 402 and plastic parts 204, 206 of the plastic housing 200, traversing over the cooling plates 106 of the discrete modules 102. Each plastic part 204, 206 of the plastic housing 200 can have one or more openings 220 at one or both ends of the plastic part 204, 206 for allowing fluid flow from one side of the plastic housing 200 to the other side after the covers 400, 402 are attached to both sides of the assembled plastic housing 200. In one embodiment, the covers 400, 402 are made of plastic and attached to the periphery of the respective plastic parts 204, 206 of the plastic housing 200 by any standard plastic attach process such as plastic welding, laser welding, heat sealing, gluing, etc.

FIGS. 5A and 5B illustrate another embodiment of a cooling apparatus 500. FIG. 5A shows an exploded view of the cooling apparatus 500, and FIG. 5B shows an assembled view of the cooling apparatus 500. According to this embodiment, the cooling apparatus 500 includes a plurality of discrete modules, two plastic housings 502, 504 and three covers 506, 508, 510. Each of the discrete modules includes a semiconductor die encapsulated by a mold compound, a plurality of leads electrically connected to the semiconductor die and protruding out of the mold compound, and a first cooling plate 106 at least partly uncovered by the mold compound e.g. as previously described herein in connection with FIG. 1. Each of the plastic housings 502, 504 surrounds a periphery of a different subset of the modules to form separate multi-die modules. Each plastic housing 502, 504 includes a first singular plastic part which receives the corresponding subset of modules and a second singular plastic part attached to a periphery of the first plastic part, the second plastic part having cutouts which expose the first cooling plates 106 and a sealing structure containing a sealing material which forms a water-tight seal around the periphery of each module at a side of the modules with the first cooling plates 106 e.g. as previously described herein in connection with FIGS. 2A, 2B and 3.

The first cover 506 is attached to the periphery of the second plastic part of the first plastic housing 502 so as to form a water-tight seal with the second plastic part of the first plastic housing 502 and an enclosed cavity 512 between the first cover 506 and the second plastic part e.g. as previously described herein in connection with FIGS. 4A and 4B. The enclosed cavity 512 between the first cover 506 and the second plastic part of the first plastic housing 502 is configured to permit fluid flow over the first cooling plates 106 of each discrete module included in the first plastic housing 502.

The second cover 508 is interposed between and attached to the first and the second plastic housings 502, 504. The second cover 508 is attached to the periphery of the second plastic part of the second plastic housing 504 so as to form a water-tight seal with the second plastic part of the second plastic housing 504 and an enclosed cavity 514 between the second cover and the second plastic part e.g. as previously described herein in connection with FIGS. 4A and 4B. The enclosed cavity 514 between the second cover 508 and the second plastic part of the second plastic housing 504 is configured to permit fluid flow over the first cooling plates 106 of each discrete module included in the second plastic housing 504. The third cover 510 is attached to the side of the second plastic housing 504 opposite the second cover 508. In one embodiment, the covers 506, 508, 510 are each made of plastic and attached to the periphery of the respective plastic parts of the plastic housings 502, 504 by any standard plastic attach process such as plastic welding, laser welding, heat sealing, gluing, over-molding, etc.

The second cover 508 is attached to the periphery of the first plastic part of the first plastic housing 502 at a side of the first plastic housing 502 facing away from the first cover 506 so as to form a water-tight seal with the first plastic part of the first plastic housing 502 and an enclosed cavity (out of view) between the second cover and the first plastic part e.g. as previously described herein in connection with FIGS. 4A and 4B. The enclosed cavity between the second cover 508 and the first plastic part of the first plastic housing 502 is configured to permit fluid flow over second cooling plates 106 of each discrete module included in the first plastic housing 502 which are disposed at a side of the modules facing away from the first cover 506.

The third cover 510 is attached to the periphery of the first plastic part of the second plastic housing 504 at a side of the second plastic housing facing away from the second cover 508 so as to form a water-tight seal with the first plastic part of the second plastic housing 508 and an enclosed cavity (out of view) between the third cover 510 and the first plastic part. The enclosed cavity between the third cover and the first plastic part of the second plastic housing 508 is configured to permit fluid flow over second cooling plates 106 of each discrete module included in the second plastic housing 504 which are disposed at a side of the modules facing away from the second cover 508.

According to the embodiment shown in FIGS. 5A and 5B, the first cover 506 has an inlet port 516 for receiving (cooled) fluid into the cooling apparatus 500 and an outlet port 518 for removing (heated) fluid from the cooling apparatus 500. According to this embodiment, the second cover 508 has one or more openings 520 configured to permit fluid flow between the first and the second plastic housings 502, 504 and allow for double-side cooling of all modules included in both plastic housings 502, 504. The third cover 510 does not have any ports according to this embodiment. Alternatively, the third cover 510 can have both inlet and outlet ports or the first cover 506 can have one port and the third cover 510 can have the other port. In each case, the openings 520 in the second cover 508 are aligned with corresponding openings 522 in the first and second plastic housings 502, 504 to permit fluid flow across the cooling plates 106 at opposing sides of the modules included in both plastic housings 502, 504.

Figures 6A, 6B:
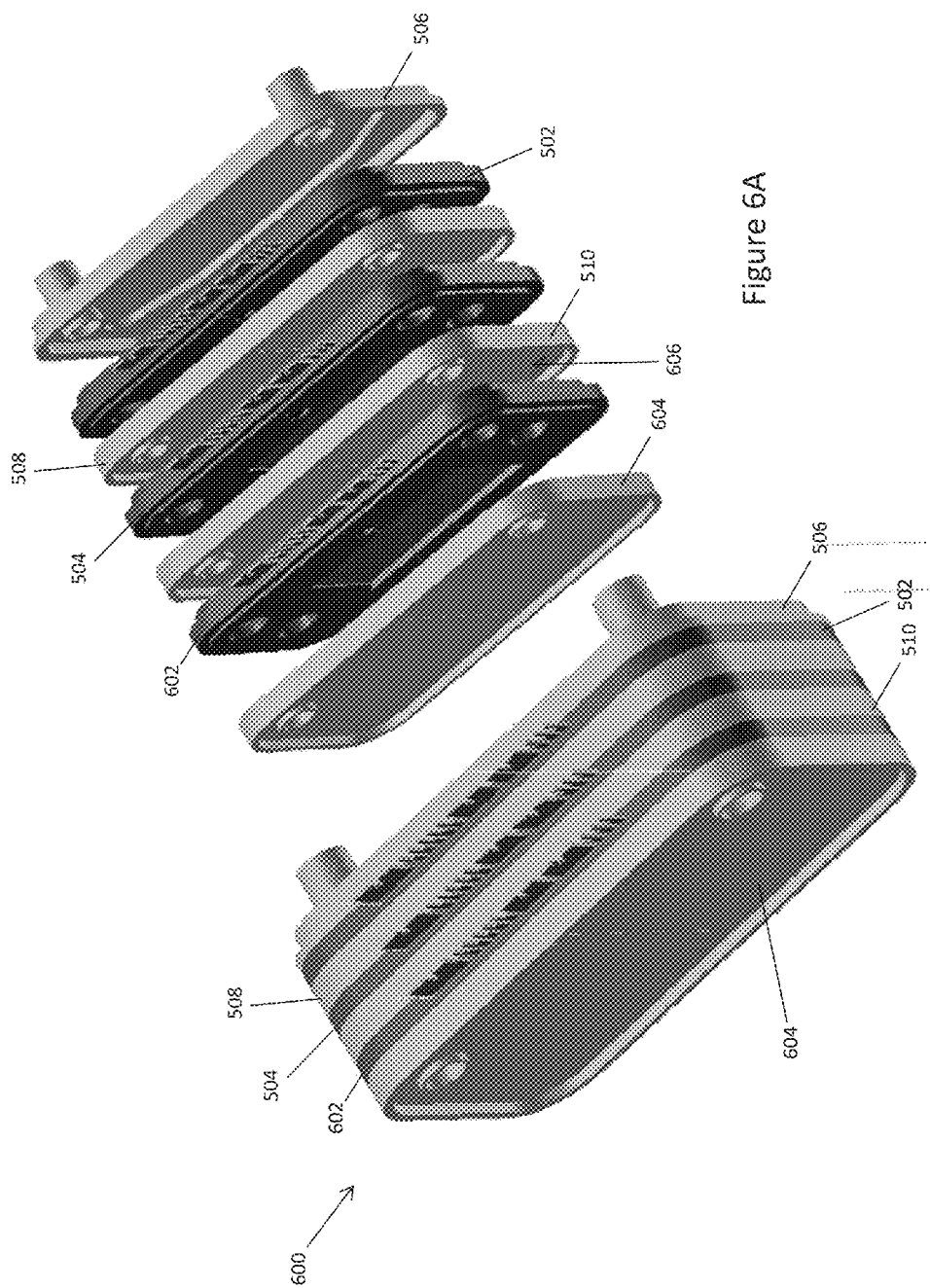
FIGS. 6A and 6B illustrates another embodiment of a plurality of covers attached to a plurality of plastic housings to form a water-tight cooling apparatus.

FIGS. 6A and 6B illustrate yet another embodiment of a cooling apparatus 600. FIG. 6A shows an exploded view of the cooling apparatus 600, and FIG. 6B shows an assembled view of the cooling apparatus 600. The embodiment shown in FIGS. 6A and 6B is similar to the embodiment shown in FIGS. 5A and 5B. The cooling system 500 shown in FIGS. 5A and 5B is extended to at least three plastic housings 502, 504, 602 and at least four covers, 506, 508, 510, 604. The third plastic housing 602 surrounds the periphery of a different subset of the modules than the first and the second plastic housings 502, 504 to form an additional multi-die module as previously described herein. The third cover 510 is attached to the periphery of the first plastic part of the second plastic housing 504 at a side of the second plastic housing 504 facing away from the second cover 508 so as to form a water-tight seal with the first plastic part of the second plastic housing 504 and an enclosed cavity 606 between the third cover 510 and the first plastic part. The enclosed cavity 606 between the third cover 510 and the first plastic part of the second plastic housing 504 is configured to permit fluid flow over second cooling plates 106 of each discrete module included in the second plastic housing 504 which face away from the second cover 508.

The fourth cover 604 is attached to the periphery of the first plastic part of the third plastic housing 602 at a side of the third plastic housing 602 facing away from the third cover 510 so as to form a water-tight seal with the first plastic part of the third plastic housing 602 and an enclosed cavity (out of view) between the fourth cover 604 and the first plastic part. The enclosed cavity between the fourth cover 604 and the first plastic part of the third plastic housing 602 is configured to permit fluid flow over second cooling plates 106 of each discrete module included in the third plastic housing 602 which face away from the third cover 510.

The cooling apparatus covers can include surface features which enhance the flow of fluid with the corresponding cooling apparatus.

Figure 7:
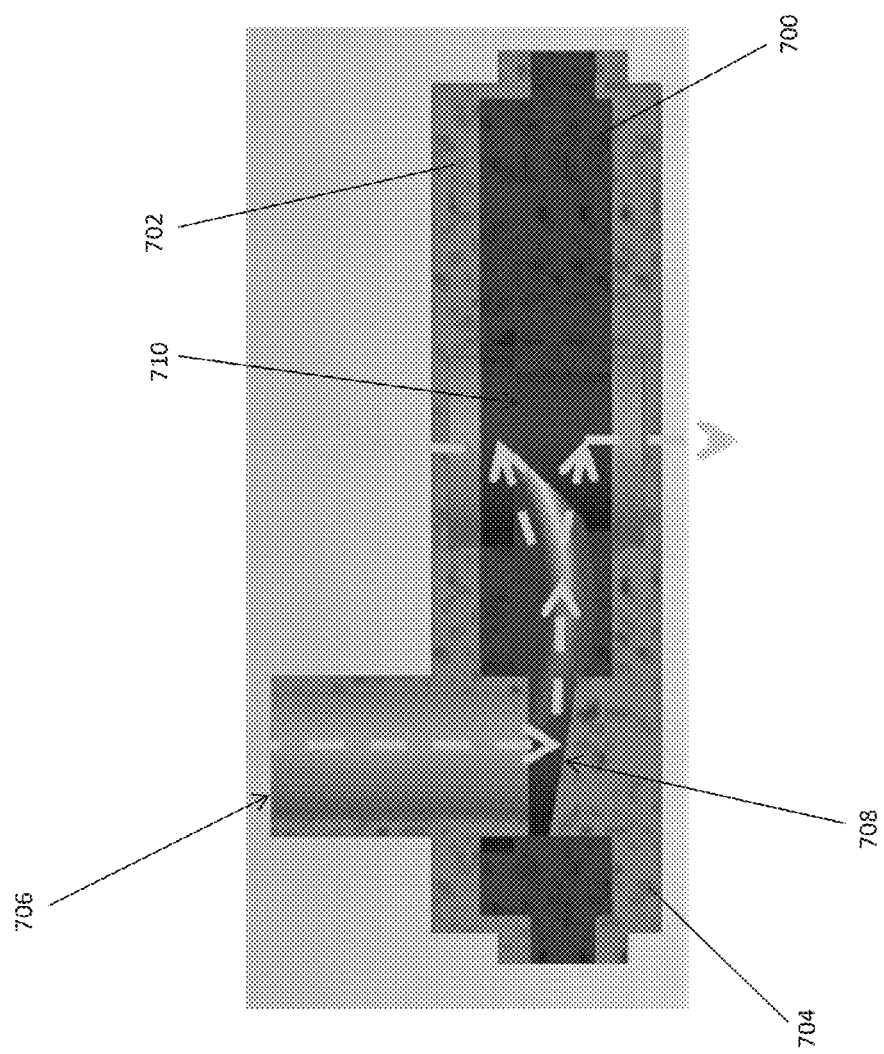
FIG. 7 shows a width-wise cross-sectional view of an embodiment of one plastic housing interposed between two covers.

FIG. 7 shows a width-wise cross-sectional view of an embodiment of a plastic housing 700 of the kind previously described herein having a water-tight seal between two covers 702, 704. Fluid enters an inlet port 706 in one cover 702. The other cover 704 can include a slanted or angled surface feature 708 for re-directing the fluid toward an opening or passage 710 in the corresponding end of the plastic housing 700. This feature allows fluid entering the inlet port 706 in the first cover 702 to more easily flow unimpeded to plastic housings above and below the plastic housing 700 shown in FIG. 7. The fluid flow path is indicated by dashed lines in FIG. 7.

Figure 8:
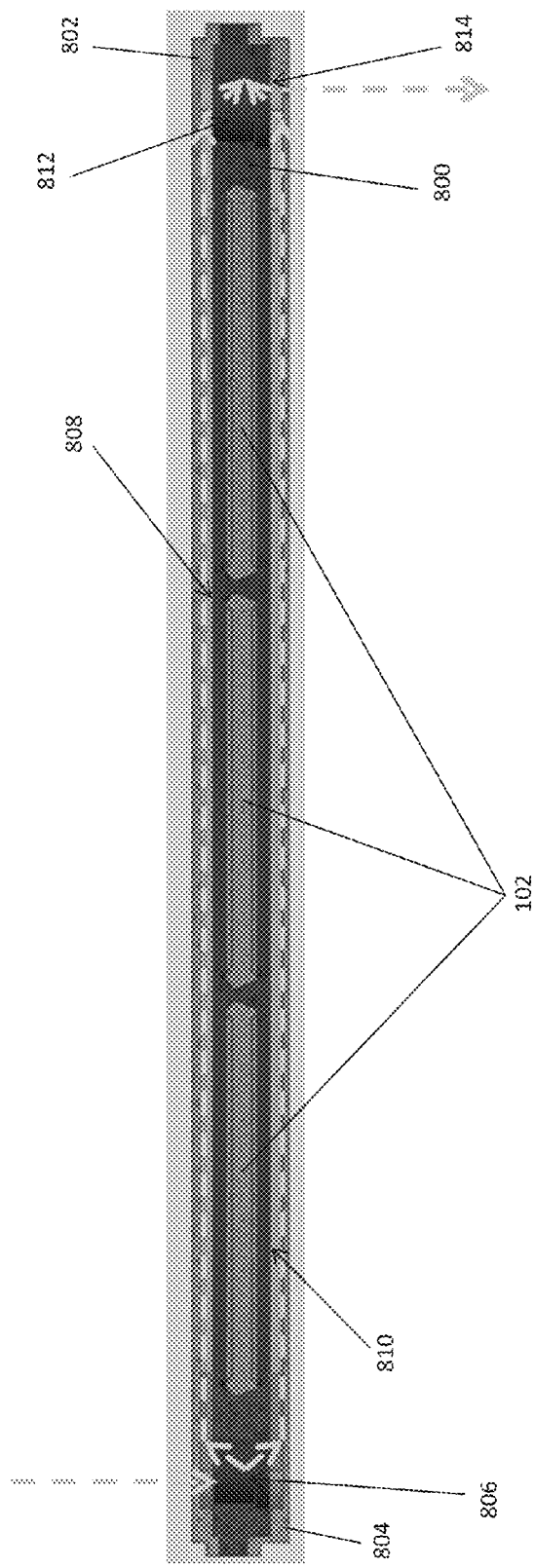
FIG. 8 shows a length-wise cross-sectional view of an embodiment of one plastic housing interposed between two covers.

FIG. 8 shows a length-wise cross-sectional view of an embodiment of a plastic housing 800 of the kind previously described herein having a water-tight seal between two covers 802, 804. Fluid enters one end of the plastic housing 800 from the top cover 802 in the left-hand side of FIG. 8. This end of the plastic housing 800 has an opening 806 which allows the fluid to split and flow in a sealed cavity 808 between the top cover 802 and the plastic housing 800 and a sealed cavity 810 between the bottom cover 804 and the plastic housing 800. At the opposite end of the plastic cavity 800, the fluid flow merges in a second opening 812 in the plastic housing 800 and is directed downward through an opening 814 in the bottom cover 804 in the right-hand side of FIG. 8. The fluid flow path is indicated by dashed lines in FIG. 8.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open-ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method of manufacturing a cooling apparatus, the method comprising:
   receiving a discrete module by a first singular part, the discrete module comprising a semiconductor die encapsulated by a mold compound, a plurality of leads electrically connected to the semiconductor die and protruding out of the mold compound, and a first cooling plate at least partly uncovered by the mold compound;

attaching a second singular part to a periphery of the first part to form a housing, the housing surrounding a periphery of the discrete module, the second part having a cutout which exposes the first cooling plate and a sealing structure facing a side of the discrete module with the first cooling plate; and filling the sealing structure with a sealing material which forms a water-tight seal around the periphery of the discrete module at the side of the discrete module with the first cooling plate.

2. The method of claim 1, wherein the sealing structure of the second part comprises a groove formed in the second part which surrounds the periphery of the discrete module at the side of the discrete module with the first cooling plate, and wherein the sealing material is injected into the groove through an opening in the second part.

3. The method of claim 2, wherein a part of the second part disposed interiorly from the groove contacts the side of the discrete module with the first cooling plate to prevent the sealing material from leaking onto the first cooling plate when injected into the groove through the opening in the second part.

4. The method of claim 1, further comprising:
attaching a first cover to a periphery of the second part to form a water-tight seal with the second part and an enclosed cavity between the first cover and the second part, the enclosed cavity configured to permit fluid flow over the first cooling plate of the discrete module.

5. The method of claim 1, wherein the discrete module has a second cooling plate at a side opposite the first cooling plate, and wherein the first part has a cutout which exposes the second cooling plate and a sealing structure, the method further comprising:
filling the sealing structure of the first part with additional sealing material which forms a water-tight seal around the periphery of the discrete module at the side of the discrete module with the second cooling plate.

6. The method of claim 5, wherein the sealing structure of the first part comprises a groove formed in the first part which surrounds the periphery of the discrete module at the side of the discrete module with the second cooling plate, and wherein the additional sealing material is injected into the groove through an opening in the first part.

7. The method of claim 6, wherein a part of the first part disposed interiorly from the groove contacts the side of the discrete module with the second cooling plate to prevent the additional sealing material from leaking onto the second cooling plate when injected into the groove through the opening in the first part.

8. The method of claim 5, further comprising:
attaching a second cover to a periphery of the first part to form a water-tight seal with the first part and an enclosed cavity between the second cover and the first part, the enclosed cavity configured to permit fluid flow over the second cooling plate of the discrete module.

9. A method of manufacturing a cooling apparatus, the method comprising:
providing a first discrete module and a second discrete module, each of the discrete modules comprising a semiconductor die encapsulated by a mold compound, a plurality of leads electrically connected to the semiconductor die and protruding out of the mold compound, a first cooling plate at least partly uncovered by the mold compound, and a housing which surrounds a periphery of the mold compound, each of the housings comprising a first singular part which receives the corresponding discrete module and a second singular part attached to a periphery of the first part, the second part having a cutout which exposes the first cooling plate and a sealing structure containing a sealing material which forms a water-tight seal around the periphery of the mold compound at a side of the discrete module with the first cooling plate;

attaching a first cover to a periphery of the second part of the housing of the first discrete module to form a water-tight seal with the second part of the housing of the first discrete module and an enclosed cavity between the first cover and the second part, the enclosed cavity configured to permit fluid flow over the first cooling plate of the first discrete module;

securing a second cover between the first and the second discrete modules, the second cover being attached to a periphery of the second part of the housing of the second discrete module to form a water-tight seal with the second part of the housing of the second discrete module and an enclosed cavity between the second cover and the second part, the enclosed cavity configured to permit fluid flow over the first cooling plate of the second discrete module; and attaching a third cover to a side of the housing of the second discrete module opposite the second cover.

10. The method of claim 9, wherein the second cover has one or more openings configured to permit fluid flow between the first and the second discrete modules.

11. The method of claim 9, wherein the second cover is attached to a periphery of the first part of the housing of the first discrete module at a side of the housing facing away from the first cover so as to form a water-tight seal with the first part of the housing of the first discrete module and an enclosed cavity between the second cover and the first part, the enclosed cavity configured to permit fluid flow over a second cooling plate of the first discrete module which is disposed at a side of the first discrete module opposite the first cooling plate.

12. The method of claim 9, wherein the third cover forms a water-tight seal with the first part of the housing of the second discrete module and an enclosed cavity between the third cover and the first part, the enclosed cavity configured to permit fluid flow over a second cooling plate of the second discrete module which is disposed at a side of the second discrete module opposite the first cooling plate.

13. The method of claim 9, further comprising:
providing a third discrete module comprising a semiconductor die encapsulated by a mold compound, a plurality of leads electrically connected to the semiconductor die and protruding out of the mold compound, a first cooling plate at least partly uncovered by the mold compound, and a housing which surrounds a periphery of the mold compound, the housing comprising a first singular part which receives the third discrete module and a second singular part attached to a periphery of the first part, the second part having a cutout which exposes the first cooling plate and a sealing structure containing a sealing material which forms a water-tight seal around the periphery of the mold compound at a side of the third discrete module with the first cooling plate;

attaching a fourth cover to a side of the housing of the third discrete module opposite the third cover; and attaching the third cover to a periphery of the first part of the housing of the third discrete module to form a water-tight seal with the first part of the housing of the third discrete module and an enclosed cavity between the third cover and the first part, the enclosed cavity configured to permit fluid flow over a second cooling plate of the third discrete module which is disposed at a side of the third discrete module opposite the first cooling plate.

14. The method of claim 13, wherein the fourth cover is attached to a periphery of the first part of the housing of the third discrete module at a side of the housing facing away from the third cover so as to form a water-tight seal with the first part of the housing of the third discrete module and an enclosed cavity between the fourth cover and the first part, the enclosed cavity configured to permit fluid flow over a second cooling plate of the third discrete module which is disposed at a side of the third discrete module opposite the first cooling plate.

15. The method of claim 14, wherein the third cover has one or more openings configured to permit fluid flow between the second and the third discrete modules.

* * * * *